United States Patent
Itani et al.

(10) Patent No.: US 7,175,707 B2
(45) Date of Patent: Feb. 13, 2007

(54) P-TYPE GAAS SINGLE CRYSTAL AND ITS PRODUCTION METHOD

(75) Inventors: Kenya Itani, Tokyo (JP); Masaya Ohnishi, Tokyo (JP); Shinji Komata, Tokyo (JP); Seiji Mizuniwa, Tokyo (JP)

(73) Assignee: Hitachi Cable Ltd., Tokyo (JP)

( * ) Notice: Subject to any disclaimer, the term of this patent is extended or adjusted under 35 U.S.C. 154(b) by 199 days.

(21) Appl. No.: 10/393,984

(22) Filed: Mar. 24, 2003

(65) Prior Publication Data

US 2004/0187768 A1    Sep. 30, 2004

(51) Int. Cl.
*C30B 11/04*    (2006.01)

(52) U.S. Cl. .............................. 117/82; 117/81; 117/83; 117/84; 117/956; 423/87; 252/62.36

(58) Field of Classification Search ........ 252/62.3 GA, 252/62.36; 423/87; 117/936, 81, 82, 83, 117/84, 956
See application file for complete search history.

(56) References Cited

U.S. PATENT DOCUMENTS

| | | | |
|---|---|---|---|
| 4,478,675 A | * | 10/1984 | Akai ........................... 117/17 |
| 4,609,530 A | * | 9/1986 | Morioka et al. ..... 252/62.3 GA |
| 4,776,971 A | * | 10/1988 | Mattera et al. ...... 252/62.3 GA |
| 5,116,455 A | * | 5/1992 | Daly ............................ 117/93 |
| 5,231,298 A | * | 7/1993 | Daly .......................... 257/191 |
| 5,661,316 A | * | 8/1997 | Kish et al. .................. 257/190 |
| 5,701,322 A | * | 12/1997 | Nagai .......................... 372/46 |
| 6,290,773 B1 | * | 9/2001 | Mizuniwa et al. ............ 117/81 |
| 6,325,849 B1 | * | 12/2001 | Hideo et al. .................. 117/82 |
| 6,409,831 B2 | * | 6/2002 | Mizuniwa et al. .......... 117/204 |
| 6,878,202 B2 | * | 4/2005 | Ohnishi et al. ............... 117/83 |

FOREIGN PATENT DOCUMENTS

JP      200-086398      3/2000

OTHER PUBLICATIONS

James Mayer and S.S. Lau, Electronic Materials Science: For Integrated Circuits in Si and GaAs, 1990, pp. 38-40 and 43-44.*

* cited by examiner

*Primary Examiner*—Yogendra Gupta
*Assistant Examiner*—G. Nagesh Rao
(74) *Attorney, Agent, or Firm*—Sughrue Mion, PLLC

(57) ABSTRACT

A p-type GaAs single crystal containing Si, Zn, B and In as dopants has an average dislocation density of 100 $cm^{-2}$ or less. It may be produced by cooling a GaAs melt containing Si, Zn, B and In as dopants in a crystal-growing container having a seed crystal placed at a lower end thereof in an upward increasing temperature gradient, to cause a single crystal to grow upward from the seed crystal.

10 Claims, 3 Drawing Sheets

P-TYPE GAAS SINGLE CRYSTAL AND ITS PRODUCTION METHOD

FIELD OF THE INVENTION

The present invention relates to a p-type GaAs single crystal with low dislocation and a method for producing it.

BACKGROUND OF THE INVENTION

Recently, laser diodes utilizing compound semiconductor materials such as GaAs, etc. have been developed as optical devices for transmitting large-volume information at a high speed. Such optical devices comprise multi-layer thin films having hetero structures, and the thin films are generally formed by a gas-phase epitaxial method or a molecular beam epitaxial method. Because the optical devices are strongly required to have such characteristics as stability and long life, epitaxial layers should have as little defect density as possible. Accordingly, it is required that semiconductor substrates on which epitaxial layers are formed have a low dislocation density.

Substrates for devices are generally cut out from semiconductor single crystals. Methods for producing semiconductor single crystals include a gas phase growing method, a liquid phase growing method, and a solid phase growing method, and single crystals of compound semiconductors are mostly produced by the liquid phase growing method. Methods for growing single crystals from seed crystals by solidifying starting material melts, as one type of the liquid phase growth method, include a horizontal Bridgman method, a vertical Bridgman method, a gradient freezing method (GF method), and a Czochralski method (CZ method) and its improved method such as a liquid-encapsulated Czochralski method (LEC method), etc.

Recently, much attention is paid to a vertical Bridgman method (VB method) as a method for producing GaAs crystals having as large diameters as more than 3 inches (76.2 mm) and a low dislocation density, instead of the LEC method. For instance, when a single crystal of a GaAs compound semiconductor is formed by the VB method, starting materials consisting of Ga and As or GaAs are charged into a crystal-growing container having a bottom on which a GaAs seed crystal is disposed, the crystal-growing container containing a starting material melt obtained by heating is moved in a space having a temperature gradient in a vertical direction, so that crystallization occurs from the lower side (from the side of the seed crystal) toward the upper side. As a result, a single crystal grows from the seed crystal in a direction perpendicular to its surface. Thus, the VB method can form high-quality, large-diameter single crystals of compound semiconductors with few crystal defects.

The high-quality, large-diameter single crystals of compound semiconductors can also be produced by a vertical gradient freeze (VGF) method in place of the VB method. The VGF method is essentially the same as the VB method, except that with a container containing a single crystal at its lower end located at a fixed position, the furnace temperature is lowered while maintaining a vertical temperature gradient, so that a single crystal is caused to grow in a direction perpendicular to the surface of a seed crystal.

Low-dislocation substrates are desired for compound semiconductor lasers and LEDs from the viewpoint of device life, efficiency, etc. The reason therefor is that because the above device is operated at a high current density, dislocation existing in the substrate would lead to the generation of heat therein, resulting in the deterioration of devices. However, p-type GaAs substrates produced by the conventional VB method have an average dislocation density of about 1000 $cm^{-2}$, and it is thus difficult to produce low-dislocation single crystals at high yield.

As a method for achieving low dislocation in the p-type GaAs substrates, JP 2000-86398 A discloses a method for achieving an average dislocation density of 500 $cm^{-2}$ or less by doping the p-type GaAs substrates with Si and B in addition to Zn, a p-type dopant. However, because impurity-hardening effects are obtained only by Si and B in the above method, it is difficult to achieve an average dislocation density of 100 $cm^{-2}$ or less.

OBJECT OF THE INVENTION

An object of the present invention is to provide a p-type GaAs crystal having an average dislocation density of 100 $cm^{-2}$ or less and its production method.

DISCLOSURE OF THE INVENTION

As a result of intensive research in view of the above objects, the inventors have found that by doping a p-type GaAs crystal with one species of p-type dopants, one species of n-type dopants and one species of neutral atoms, and further with In as a neutral atom, it is possible to accelerate an impurity hardening effect thereby easily obtaining p-type GaAs having an average dislocation density of 100 $cm^{-2}$ or less, which has conventionally been difficult. The present invention has been completed based on this finding.

Thus, the p-type GaAs single crystal of the present invention comprises as dopants, Si, Zn, B and In, thereby having an average dislocation density of 100 $cm^{-2}$ or less.

As the dopants, part of Si may be substituted by at least one selected from the group consisting of S, Te, Sn and Se; part of Zn may be substituted by at least one selected from the group consisting of C, Be, Cd, Li, Ge, Mg and Mn; part of B may be substituted by at least one selected from the group consisting of Al, Sb and P; and part of In may be substituted by at least one selected from the group consisting of Al, Sb and P.

Preferably contained as the dopants are $1.0 \times 10^{17}$ to $5.0 \times 10^{19}/cm^3$ of Si atoms, $1.0 \times 10^{18}$ to $1.0 \times 10^{20}/cm^3$ of Zn atoms, $1.0 \times 10^{17}$ to $5.0 \times 10^{19}/cm^3$ of B atoms, and $1.0 \times 10^{17}$ to $5.0 \times 10^{19}/cm^3$ of In atoms.

The electric characteristics of the p-type GaAs single crystal of the present invention are preferably a carrier concentration n of $1.0 \times 10^{17}$ to $6.0 \times 10^{19}$ $cm^{-3}$, mobility μ of 10 to 300 $cm^2/V \cdot sec$, and a specific resistance ρ of 0.001 to 1.0 $\Omega \cdot cm$.

The first method for producing a p-type GaAs single crystal having an average dislocation density of 100 $cm^{-2}$ or less according to the present invention comprises cooling a GaAs melt containing dopants in a crystal-growing container having a seed crystal placed at a lower end thereof in an upward increasing temperature gradient to cause a single crystal to grow upward from the seed crystal, wherein Si, Zn, B and In are used as the dopants.

The second method for producing a p-type GaAs single crystal having an average dislocation density of 100 $cm^{-2}$ or less according to the present invention comprises cooling a GaAs melt containing dopants in a crystal-growing container having a seed crystal placed at one horizontal end thereof in a temperature gradient, with which a temperature increases from the side of the seed crystal toward the other horizontal end, to cause a single crystal to grow from the seed crystal, wherein Si, Zn, B and In are used as the dopants.

The third method for producing a p-type GaAs single crystal having an average dislocation density of 100 cm$^{-2}$ or less according to the present invention comprises lifting a shaft having a seed crystal disposed at a lower end thereof from a GaAs melt containing dopants in an As atmosphere, to cause a single crystal to continuously grow from the melt, wherein Si, Zn, B and In are used as the dopants.

DESCRIPTION OF THE PREFERRED EMBODIMENTS

[1] p-Type GaAs Single Crystal

Figure 1:
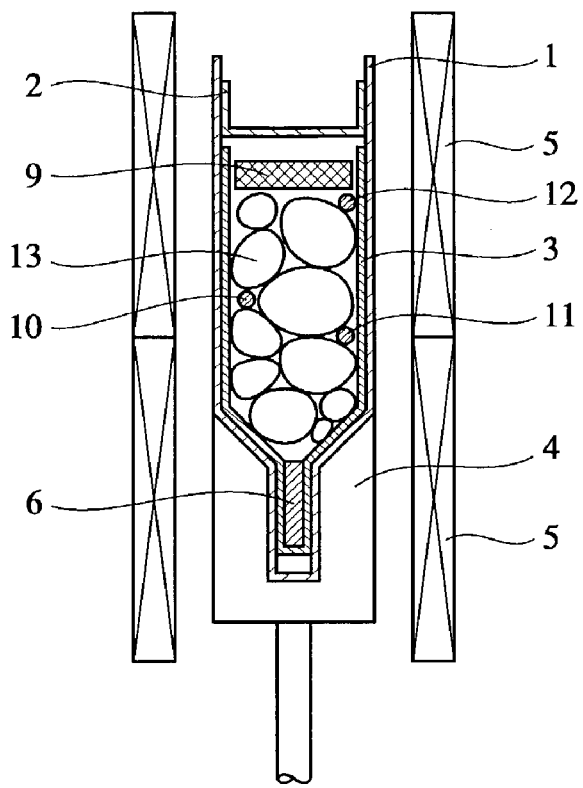
FIG. 1 is a schematic cross-sectional view showing one example of a crystal-growing furnace for a VB method.

The electric characteristics of the p-type GaAs single crystal of the present invention are preferably a carrier concentration n of $1.0 \times 10^{17}$ to $6.0 \times 10^{19}$ cm$^{-3}$, mobility μ of 10 to 300 cm$^2$/V·sec, and a specific resistance ρ of 0.001 to 1.0 Ω·cm.

The p-type GaAs single crystal of the present invention contains as dopants Zn (p-type dopant), Si (n-type dopant), B (neutral atom), and In (neutral atom).

Table 1 shows the percentages of the dopants that can achieve an average dislocation density of 100 cm$^{-2}$ or less in the above electric characteristic range of the p-type GaAs single crystal. The concentration of Zn atoms is preferably $1.0 \times 10^{18}$ to $1.0 \times 10^{20}$/cm$^3$; the concentration of Si atoms is preferably $1.0 \times 10^{17}$ to $5.0 \times 10^{19}$/cm$^3$; the concentration of B atoms is preferably $1.0 \times 10^{17}$ to $5.0 \times 10^{19}$/cm$^3$; and the concentration of In atoms is preferably $1.0 \times 10^{17}$ to $5.0 \times 10^{19}$/cm$^3$. If the concentration of In atoms exceeds $1.0 \times 10^{19}$/cm, impurities are deposited, causing defects in an epitaxial layer. Accordingly, the concentration of In atoms is more desirably in a range of $1.0 \times 10^{17}$ to $1.0 \times 10^{19}$/cm$^3$.

The effects of low dislocation start to appear when the concentration of Si atoms becomes $0.3 \times 10^{18}$/cm$^3$ or more, when the concentration of B atoms becomes $0.3 \times 10^{18}$/cm$^3$ or more, and when the concentration of In atoms becomes $0.3 \times 10^{18}$/cm$^3$ or more. However, when the total concentration of the above three types of atoms exceeds $1.5 \times 10^{19}$/cm$^3$, deposits are formed due to impurity atoms. Accordingly, with respect to the concentration of each impurity in a practically used carrier concentration range (n=$0.5 \times 10^{19}$ to $4.0 \times 10^{19}$ cm$^{-3}$), it is more preferable that the concentration of Zn atoms is $0.5 \times 10^{19}$ to $6.0 \times 10^{19}$/cm$^3$, that the concentration of Si atoms is $0.3 \times 10^{18}$ to $5.0 \times 10^{18}$/cm$^3$, that the concentration of B atoms is $0.3 \times 10^{18}$ to $5.0 \times 10^{18}$/cm$^3$, and that the concentration of In atoms is $0.3 \times 10^{18}$ to $5.0 \times 10^{18}$/cm$^3$.

TABLE 1

Concentration of Impurities in p-Type GaAs Crystal

| Atom | Concentration (cm$^{-3}$) |
| --- | --- |
| Zn | $1.0 \times 10^{18}$ to $1.0 \times 10^{20}$ |
| Si | $1.0 \times 10^{17}$ to $5.0 \times 10^{19}$ |
| B | $1.0 \times 10^{17}$ to $5.0 \times 10^{19}$ |
| In | $1.0 \times 10^{17}$ to $5.0 \times 10^{19}$ |

The same effects can be obtained even when part of Zn, a p-type dopant, is substituted by at least one selected from the group consisting of C, Be, Cd, Li, Ge, Mg and Mn; when part of Si, an n-type dopant, is substituted by at least one selected from the group consisting of S, Te, Sn and Se; or when part of In or B, a neutral atom, is substituted by at least one selected from the group consisting of Al, Sb and P. However, it is desirable to obtain the effects of low dislocation that as neutral atoms, two types or more of atoms including at least B and In are contained as impurities, and that the total concentration of the neutral atoms is $0.5 \times 10^{18}$/cm$^3$ or more.

[2] Production Method

As the production method of the p-type GaAs single crystal of the present invention having an average dislocation density of 100 cm$^{-2}$ or less, a lateral boat method such as a horizontal Bridgman (HB) method and a horizontal temperature gradient solidification (GF) method; a vertical boat method such as a vertical Bridgman (VB) method and a vertical temperature gradient freeze (VGF) method; and a vapor pressure-controlled Czochralski (VCZ) method, etc. are preferably used. Among them, the most effective single crystal-growing methods to obtain the effects of low dislocation are the VB method and the VGF method.

(1) First Production Method

One example of the first method for producing the p-type GaAs single crystal of the present invention will be explained referring to FIG. 1, which schematically shows a crystal-growing furnace for a VB method. The crystal-growing furnace comprises a quartz glass container 1, a quartz glass cap 2, a crystal-growing container 3, a supporter 4, and a heating means 5 whose lower side is a low-temperature side. To produce the p-type GaAs single crystal, a seed crystal 6 is first placed at a lower end of the crystal-growing container 3, and GaAs (or Ga and As) 13 as a crystal-growing material and Zn, Si and In (shown by 10, 11 and 12, respectively, in the figure) as dopants are placed thereon. Further placed thereon is boron oxide ($B_2O_3$) 9 as a dopant.

The crystal-growing container 3 is heated by the heating means 5 to produce a GaAs melt containing dopants in the crystal-growing container 3. At this time, part of the seed crystal is melted for seeding. The quartz glass container 1 is then moved downward (toward the low-temperature side of the heating means 5), so that the GaAs melt containing dopants is gradually cooled in an upward increasing temperature gradient. As a result, the p-type GaAs single crystal grows upward (from the side of the seed crystal 9).

In the VGF method, on the other hand, the quartz glass container 1 is stationary, and the temperature is gradually lowered while keeping the upward increasing temperature gradient, to give the same thermal hysteresis as in the VB method to materials inside the container 1, thereby cooling and solidifying the material. As a result, a single crystal grows from the seed crystal in a direction perpendicular to a surface thereof. The p-type GaAs single crystal is produced in the same manner as in the above VB method except for the above.

(2) Second production method

Figure 2:
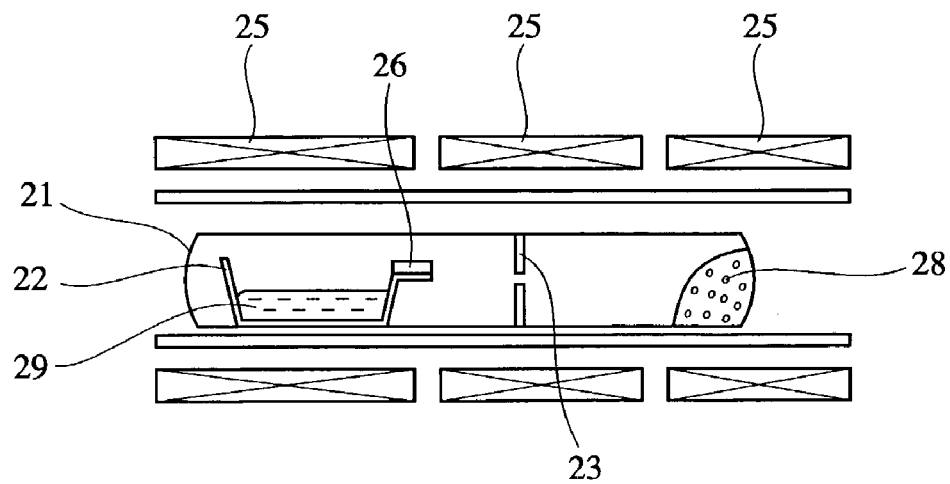
FIG. 2 is a schematic cross-sectional view showing one example of a crystal-growing furnace for an HB method.

One example of the second method for producing the p-type GaAs single crystal of the present invention will be explained referring to FIG. 2, which schematically shows a crystal-growing furnace for an HB method. The crystal-growing furnace comprises a quartz reaction tube 21, a crystal-growing container (quartz boat) 22, a diffusion barrier wall 23, and a heating means 25. The quartz boat 22 and As (indicated by 28 in the figure) as a crystal-growing material are placed in the quartz reaction tube 21 on both sides of the diffusion barrier wall 23. A seed crystal 26 is disposed on one horizontal end portion (shelf) of the quartz boat 22, and Ga (indicated by 29 in the figure) as a crystal-growing material and Zn, Si, $B_2O_3$ and In as dopants are charged into the quartz boat 22.

After evacuating the quartz reaction tube 21 to vacuum, the quartz reaction tube 21 is heated by the heating means 25, so that an As gas sublimed from solid As is reacted with Ga to form a GaAs melt containing dopants without contact with the seed crystal 26. With the GaAs melt containing dopants in contact with the seed crystal 26, the GaAs melt containing dopants is gradually cooled in a temperature gradient, with which a temperature increases from the side of the seed crystal 26 toward the other horizontal end, thereby growing the p-type GaAs single crystal from the seed crystal 26 toward the other horizontal end. Incidentally, GaAs polycrystal may be used as the crystal-growing material in place of Ga and As to form a GaAs melt containing dopants.

(3) Third Production Method

Figure 3:
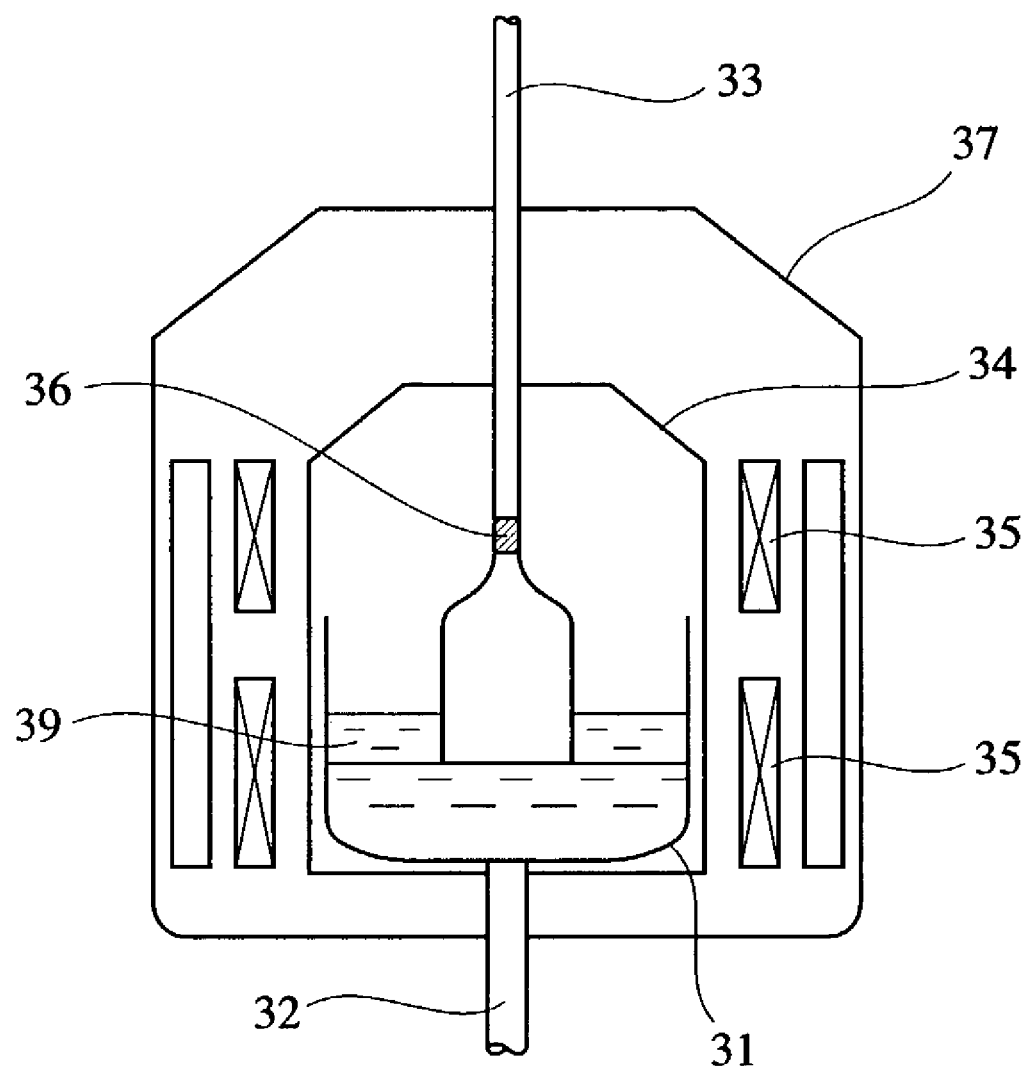
FIG. 3 is a schematic cross-sectional view showing one example of a crystal-growing furnace for a VCZ method.

One example of the third method for producing the p-type GaAs single crystal of the present invention will be explained referring to FIG. 3, which schematically shows a crystal-growing furnace for a vapor pressure-controlled Czochralski (VCZ) method. The crystal-growing furnace comprises a crucible 31, a crucible shaft 32, a lifting shaft 33, a gas-tight container 34, a heating means 35, and a pressure-resistant container 37. Polycrystalline GaAs (or Ga and As) as a crystal-growing material, and $B_2O_3$, Zn, Si and In as dopants are charged into the crucible 31, and the crucible 31 and its vicinity are heated by the heating means 35 to produce a GaAs melt containing dopants. The gas-tight container 34 is filled with a mixed gas of gaseous $As_2$ and $As_4$ generated from solid As placed in the container 34 with an inert gas. Next, by lowering the lifting shaft 33 having the seed crystal 36 disposed at a lower end thereof, it is caused to penetrate through $B_2O_3$ on the surface and thus brought into contact with the melt for seeding. Thereafter, while moving the shaft 33 upward, the p-type GaAs single crystal is continuously grown from the melt.

As is clear from the above, the production method of the p-type GaAs single crystal of the present invention is characterized in that by doping Zn (p-type dopant), Si (n-type dopant) and B (neutral atom) as well as In (neutral atom), a low-dislocation, p-type GaAs crystal having an average dislocation density of 100 $cm^{-2}$ or less is produced. The dopants are preferably placed in the crystal-growing container, such that Zn atoms are $1.0 \times 10^{18}$ to $1.0 \times 10^{20}/cm^3$, Si atoms are $1.0 \times 10^{17}$ to $5.0 \times 10^{19}/cm^3$, B atoms are $1.0 \times 10^{17}$ to $5.0 \times 10^{19}/cm^3$, and In atoms are $1.0 \times 10^{17}$ to $5.0 \times 10^{19}/cm^3$.

Thus, the method of the present invention can provide a p-type GaAs single crystal having an average dislocation density of 100 $cm^{-2}$ or less more easily than the conventional technology, particularly single crystal wafers free from dislocation (within 500 when converted to a 3-inch wafer). By using substrates produced from the p-type GaAs single crystal of the present invention as substrates for compound semiconductor lasers, it is possible to obtain high-reliability (long-life) lasers.

The present invention will be described in detail referring to Examples below without intention of limiting the present invention thereto.

EXAMPLE 1

(1) Production of p-Type GaAs Single Crystal

As shown in FIG. 1, a seed crystal 6 was placed at a lower end of a crystal-growing container 3, and 6500 g of GaAs as a starting material, and 3.0 g of Zn, 1.0 g of Si, 100 g of $B_2O_3$, and 2.0 g of In as dopants were disposed thereon in the crystal-growing container 3. Next, a quartz glass cap 2 was mounted to a quartz glass container 1, which was then sealed in vacuum, and the vacuum-sealed quartz glass container 1 was placed on a supporter 4. Thereafter, the crystal-growing container 3 and the quartz glass container 1 were heated by a heating means 5. The heating temperatures were about 1200° C. at the seed crystal 6 and about 1245° C. at the materials thereon. After melting the materials, seeding was carried out while adjusting a temperature gradient in a solid-liquid interface at about 5° C./cm. After completion of seeding, the quartz glass container 1 was moved downward at a speed of 3 mm/hr to solidify the resultant crystal. After completing the overall solidification, the temperature of the heating means 5 was lowered to room temperature at a speed of about 30° C./hr, and the quartz glass container 1 was taken out from the heating means 5. Obtained by the above process was a low-dislocation GaAs single crystal of about 3 inches in diameter and about 180 mm in length of a cylindrical body portion.

(2) Evaluation

Figure 4:
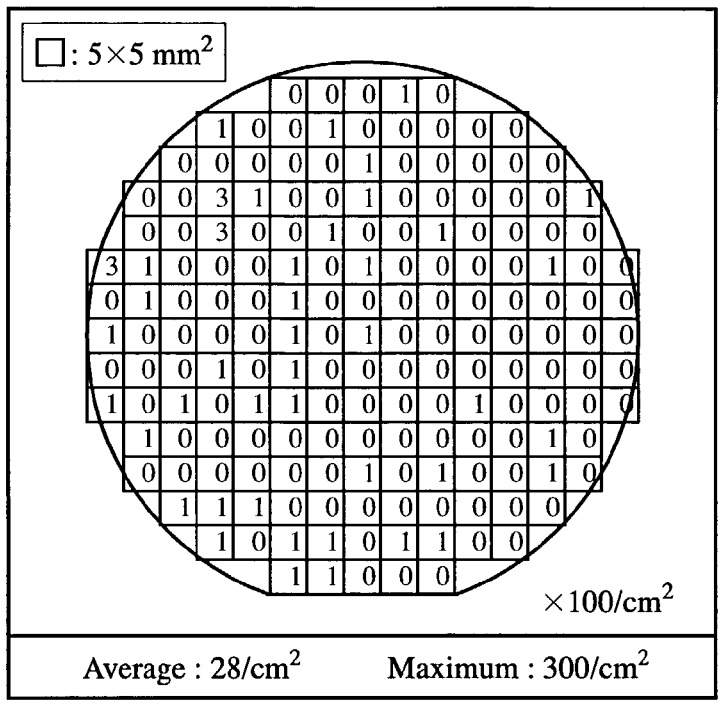
FIG. 4 is a view showing a dislocation density distribution in the p-type GaAs substrate of Example 1.

A wafer cut out from the resultant 3-inch, p-type GaAs single crystal was subjected to etching in a KOH solution at 450° C. for 15 minutes, and measured with respect to dislocations at a 5-mm interval in a wafer surface by an optical microscope. The number of dislocations observed in a 1-$mm^2$ field was converted to that in a 1-$cm^2$ field. The results are shown in FIG. 4. The average dislocation density calculated from the above results was 28 $cm^{-2}$, lower than those achieved by the conventional technologies by one, order. The cut-out wafer was evaluated by a GDMS method. A solidification ratio, a carrier concentration, the concentration of Zn, Si, B and In, and an average dislocation density are shown in Table 2.

EXAMPLE 2

A p-type GaAs single crystal was produced in the same manner as in Example 1 except for using 3.0 g of Zn, 0.5 g of Si, 50 g of $B_2O_3$, and 1.0 g of In as dopants. A wafer cut out from the resultant single crystal was evaluated by a GDMS method. A solidification ratio, a carrier concentration, the concentration of Zn, Si, B and In, and an average dislocation density are shown in Table 2.

EXAMPLE 3

A p-type GaAs single crystal was produced in the same manner as in Example 1 except for using 3.0 g of Zn, 0.4 g of Si, 50 g of $B_2O_3$, and 0.5 g of In as dopants. A wafer cut out from the resultant single crystal was evaluated by a GDMS method. A solidification ratio, a carrier concentration, the concentration of Zn, Si, B and In, and an average dislocation density are shown in Table 2.

COMPARATIVE EXAMPLE 1

Figure 5:
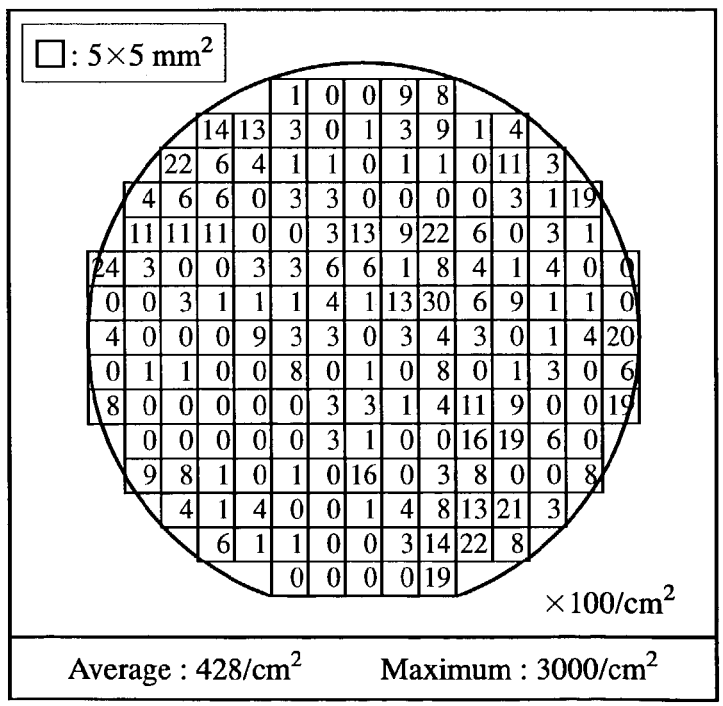
FIG. 5 is a view showing a dislocation density distribution in the p-type GaAs substrate of Comparative Example 1.

A p-type GaAs single crystal was produced in the same manner as in Example 1 except for excluding In from the dopants. A wafer cut out from the resultant single crystal was subjected to etching in a KOH solution at 450° C. for 15 minutes, and the number of dislocations in the wafer was measured by an optical microscope in the same manner as in Example 1. the measurement results are shown in FIG. 5. The cut-out wafer was also evaluated by a GDMS method. A solidification ratio, a carrier concentration, the concentration of Zn, Si, B and In, and an average dislocation density are shown in Table 2.

COMPARATIVE EXAMPLE 2

A p-type GaAs single crystal was produced in the same manner as in Example 1 except for using 3.0 g of Zn, 0.8 g of Si and 50 g of $B_2O_3$ as dopants. A wafer cut out from the resultant single crystal was evaluated by a GDMS method. A solidification ratio, a carrier concentration, the concentration of Zn, Si, B and In, and an average dislocation density are shown in Table 2.

TABLE 2

| No. | Concentration of Impurities ($cm^{-3}$) | | | |
|---|---|---|---|---|
| | Zn | Si | B | In |
| Example 1 | $1.5 \times 10^{19}$ | $0.7 \times 10^{18}$ | $1.4 \times 10^{18}$ | $1.6 \times 10^{18}$ |
| Example 2 | $1.4 \times 10^{19}$ | $0.5 \times 10^{18}$ | $0.7 \times 10^{18}$ | $0.5 \times 10^{18}$ |
| Example 3 | $1.0 \times 10^{19}$ | $0.2 \times 10^{18}$ | $0.3 \times 10^{18}$ | $0.4 \times 10^{18}$ |
| Comparative Example 1 | $1.0 \times 10^{19}$ | $0.9 \times 10^{18}$ | $1.0 \times 10^{18}$ | Not Detected |
| Comparative Example 2 | $2.0 \times 10^{19}$ | $1.0 \times 10^{18}$ | $1.6 \times 10^{18}$ | Not Detected |

| No. | Solidification Ratio | Carrier Concentration ($cm^{-3}$) | Average Dislocation Density ($cm^{-2}$) |
|---|---|---|---|
| Example 1 | 0.4 | $1.3 \times 10^{19}$ | 28 |
| Example 2 | 0.4 | $1.1 \times 10^{19}$ | 74 |
| Example 3 | 0.4 | $0.8 \times 10^{19}$ | 93 |
| Comparative Example 1 | 0.4 | $0.8 \times 10^{19}$ | 428 |
| Comparative Example 2 | 0.4 | $1.5 \times 10^{19}$ | 361 |

Though the condition that the average dislocation density is 100 $cm^{-2}$ or less is met in any of Examples, the average dislocation density is 361 to 428 $cm^{-2}$ in Comparative Examples, indicating that the average dislocation density in Comparative Examples is higher than that in Examples, in which the p-type GaAs single crystal is doped with In.

As described above, because the p-type GaAs single crystal of the present invention is doped with four types or more of atoms including at least Si, Zn, B and In as dopants, it has as low an average dislocation density as 100 $cm^{-2}$ or less. Therefore, compound semiconductor lasers, light-emitting diodes, etc. having high efficiency and long life can be produced therefrom.

What is claimed is:

1. A p-type GaAs single crystal comprising Si, Zn, B and In as dopants, thereby having an average dislocation density of 100 $cm^{-2}$ or less, wherein the concentration of B atoms is $1.0 \times 10^{17}$ to $5.0 \times 10^{19}/cm^3$ and the concentration of In atoms is $0.3$–$5.0 \times 10^{18}/cm^3$, and wherein the total concentration of neutral atoms including at least B and In is $0.5 \times 10^{18}/cm^3$ or more so as to improve electrical characteristics.

2. The p-type GaAs single crystal according to claim 1, wherein part of Si is substituted by at least one selected from the group consisting of S, Te, Sn and Se.

3. The p-type GaAs single crystal according to claim 1, wherein part of Zn is substituted by at least one selected from the group consisting of C, Be, Cd, Li, Ge, Mg and Mn.

4. The p-type GaAs single crystal according to claim 1, wherein part of B is substituted by at least one selected from the group consisting of Al, Sb and P.

5. The p-type GaAs single crystal according to claim 1, wherein part of In is substituted by at least one selected from the group consisting of Al, Sb and P.

6. The p-type GaAs single crystal according to claim 1, wherein the concentration of Si atoms is $1.0 \times 10^{17}$ to $5.0 \times 10^{19}/cm^3$.

7. The p-type GaAs single crystal according to claim 1, wherein the concentration of Zn atoms is $1.0 \times 10^{18}$ to $1.0 \times 10^{20}/cm^3$.

8. The p-type GaAs single crystal according to claim 1, wherein it has a carrier concentration n of $1.0 \times 10^{17}$ to $6.0 \times 10^{19}$ $cm^{-3}$, mobility μ of 10 to 300 $cm^2$/V·sec, and a specific resistance p of 0.001 to 1.0 Ω·cm as electric characteristics.

9. The p-type GaAs single crystal according to claim 1, wherein the concentration of Si atoms is $1.0 \times 10^{17}$ to $5.0 \times 10^{19}/cm^3$, the concentration of Zn atoms is $1.0 \times 10^{18}$ to $1.0 \times 10^{20}/cm^3$, the concentration of B atoms is $1.0 \times 10^{17}$ to $5.0 \times 10^{19}/cm^3$, and the concentration of In atoms is $0.3$–$5.0 \times 10^{18}/cm^3$, and further the total concentration of Si atoms, B atoms and In atoms is $1.5 \times 10^{19}/cm^3$ or less.

10. The p-type GaAs single crystal according to claim 1, whereint he average dislocation density is 28–93 $cm^{-2}$.

* * * * *